(12) United States Patent
Asami et al.

(10) Patent No.: US 11,789,055 B2
(45) Date of Patent: Oct. 17, 2023

(54) TEST APPARATUS OF ANTENNA ARRAY

(71) Applicant: ADVANTEST CORPORATION, Tokyo (JP)

(72) Inventors: Koji Asami, Tokyo (JP); Shin Masuda, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 17/701,998

(22) Filed: Mar. 23, 2022

(65) Prior Publication Data

US 2022/0326290 A1 Oct. 13, 2022

(30) Foreign Application Priority Data

Apr. 13, 2021 (JP) ................................. 2021-067722

(51) Int. Cl.
*G01R 29/10* (2006.01)
*G01R 29/08* (2006.01)

(52) U.S. Cl.
CPC ......... *G01R 29/10* (2013.01); *G01R 29/0885* (2013.01)

(58) Field of Classification Search
CPC .............. G01R 29/10; G01R 29/0885; G01R 29/0871; H04B 1/72
See application file for complete search history.

(56) References Cited

U.S. PATENT DOCUMENTS

| 2005/0219107 | A1* | 10/2005 | Guidry ............... H03M 1/1285 341/163 |
| 2015/0016616 | A1* | 1/2015 | Roth ..................... H04R 29/00 381/56 |
| 2015/0185256 | A1 | 7/2015 | Fujinoki |
| 2019/0348760 | A1* | 11/2019 | Lee .................... G01R 31/2822 |
| 2020/0021370 | A1* | 1/2020 | Huynh ................ H04B 17/102 |
| 2020/0145110 | A1 | 5/2020 | Schuetz et al. |
| 2021/0175932 | A1* | 6/2021 | van der Weide .... H04B 5/0081 |
| 2022/0268886 | A1* | 8/2022 | Shamsinejad .......... G01R 29/10 |

FOREIGN PATENT DOCUMENTS

| CN | 109669113 A | 4/2019 |
| CN | 110672931 A | 1/2020 |
| JP | 2004012468 A | 1/2004 |
| JP | 2009276092 A | 11/2009 |

(Continued)

OTHER PUBLICATIONS

Korean Notice of Opinion Submission corresponding to KR Applicaton No. 10-2022-0034580; dated Mar. 21, 2023.

(Continued)

*Primary Examiner* — Alvaro E Fortich
(74) *Attorney, Agent, or Firm* — CANTOR COLBURN LLP

(57) ABSTRACT

A test apparatus inspects an antenna element or a device including the antenna element as a DUT by OTA. A front-end unit includes a plurality of electric field detection elements provided to face a plurality of points on a radiation surface of the antenna element of the DUT. The plurality of electric field detection elements can simultaneously detect the electric fields formed at the corresponding points by the DUT, respectively. A tester body receives a plurality of detection signals from the front-end unit and evaluates the DUT.

8 Claims, 7 Drawing Sheets

(56) References Cited

FOREIGN PATENT DOCUMENTS

| | | |
|---|---|---|
| JP | 2018009840 A | 1/2018 |
| JP | 2019074519 A | 5/2019 |
| JP | 2019113355 A | 7/2019 |
| KR | 20210034590 A | 3/2021 |
| TW | I247119 | 1/2006 |
| WO | 2009072775 A1 | 6/2009 |
| WO | 20190243449 A2 | 12/2019 |
| WO | 2020091071 A1 | 5/2020 |

OTHER PUBLICATIONS

Taiwanese Notice of Examination Opinion corresponding to TW Application No. 111110815; dated Feb. 24, 2023.

* cited by examiner

TEST APPARATUS OF ANTENNA ARRAY

CROSS REFERENCE TO RELATED APPLICATIONS

The present invention claims priority under 35 U.S.C. § 119 to Japanese Application, 2021-067722, filed on Apr. 13, 2021, the entire contents of which being incorporated herein by reference.

BACKGROUND

1. Technical Field

The present disclosure relates to analysis and evaluation of an antenna array.

2. Description of the Related Art

With an increase in the capacity of wireless communication, the bandwidth of baseband signals and RF signals has been widened. In a 5G mobile communication system or a next generation wireless LAN, a broadband baseband signal ranging from several hundred MHz to several GHz is carried using a carrier signal in a millimeter wave band. In such high-speed communication, multiple-input and multiple-output (MIMO) is adopted.
Patent Literature 1: JP 2004-012468 A
Patent Literature 2: WO 2020-091071 A
Patent Literature 3: JP 2018-009840 A
Patent Literature 4: JP 2009-276092 A
Patent Literature 5: JP 2019-113355 A

SUMMARY

The present disclosure has been made in such a situation, and an exemplary object of one aspect thereof is to provide a test apparatus capable of evaluating an antenna alone or a device with the antenna by OTA (Over The Air).

An aspect of the present disclosure relates to a test apparatus using an antenna element or a device including the antenna element as a device under test. The test apparatus includes: a front-end unit that includes a plurality of electric field detection elements provided to face a plurality of points on a radiation surface of the antenna element of the device under test and capable of simultaneously detecting electric fields formed at corresponding points by the device under test, and transmits a plurality of detection signals indicating the electric fields at the plurality of points; and a tester body that receives the plurality of detection signals from the front-end unit and inspects the device under test.

Incidentally, any combination of the above components and the result obtained by mutually replacing the components and expressions of the present disclosure between methods, devices, and the like are also effective as aspects of the present disclosure.

According to one aspect of the present disclosure, when the front-end unit is added to the existing tester body, an antenna alone or a device with the antenna can be evaluated by OTA.

BRIEF DESCRIPTION OF THE DRAWING

Embodiments will now be described, by way of example only, with reference to the accompanying drawings which are meant to be exemplary, not limiting, and wherein like elements are numbered alike in several Figures, in which.

DETAILED DESCRIPTION

Summary of Embodiment

Figure 1:
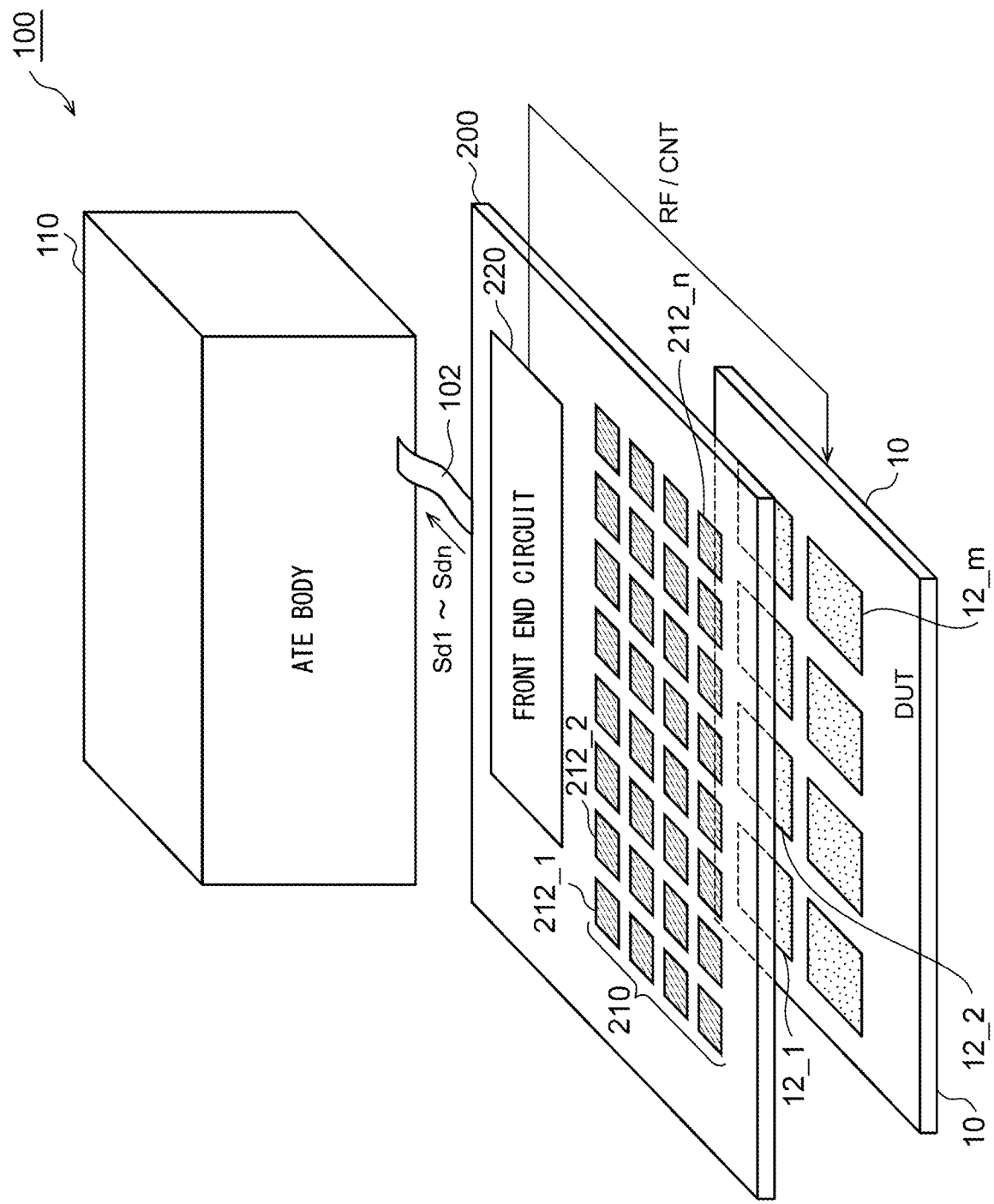
FIG. 1 is a diagram illustrating a test apparatus according to an embodiment.

A summary of some exemplary embodiments of the present disclosure will be described. This summary describes some concepts of one or more embodiments in a simplified manner for the purpose of basic understanding of the embodiments as a prelude to the detailed description to be given later, and does not limit the breadth of the invention or disclosure. In addition, this summary is not a comprehensive summary of all possible embodiments and does not limit the essential components of the embodiments. For convenience, "one embodiment" may be used to refer to one embodiment (example or modification) or a plurality of embodiments (examples or modifications) disclosed in the present specification.

This summary is not an extensive summary of all possible embodiments, and is not intended to specify key elements of all embodiments or key elements or to delineate the scope of some or all aspects. The sole purpose thereof is to present some concepts of one or more embodiments in a simplified form as a prelude to the more detailed description to be given later.

A test apparatus according to one embodiment tests an antenna element or a device including the antenna element as a device under test. The test apparatus includes: a front-end unit that includes a plurality of electric field detection elements provided to face a plurality of points on a radiation surface of the antenna element of the device under test and capable of simultaneously detecting electric fields formed at corresponding points by the device under test, and transmits a plurality of detection signals indicating the electric fields at the plurality of points; and a tester body that receives the plurality of detection signals from the front-end unit and inspects the device under test (antenna element).

The front-end unit functions as an alternative to a performance board when testing a typical semiconductor device, and the front-end unit including the plurality of electric field detection elements and the tester body are combined to configure the test apparatus. By transmitting a detection signal from the front-end unit to the tester body in a form supported by the tester body, it is possible to test an antenna alone or a device with the antenna by OTA by utilizing the existing tester body.

In one embodiment, the plurality of detection signals may be obtained by down-converting outputs of the plurality of electric field detection elements. In the front-end unit, the frequency of the detection signal indicating the electric field is dropped to a frequency band which can be processed by the tester body and transmitted, so that a test using the interface of the existing tester body can be performed.

In one embodiment, the front-end unit may digitize the plurality of detection signals and transmits the digitized detection signals to the tester body. In this case, the tester body can receive and process the plurality of the digitized detection signals by using a digital module included in the tester body.

In one embodiment, the plurality of electric field detection elements may be a plurality of electro-optic (EO) sensors. By using the electro-optic sensor using the electro-optic effect, the electric field can be measured without disturbing the state of the antenna to be tested.

In one embodiment, the front-end unit may include a light source structured to irradiate the plurality of electro-optic sensors with lights modulated at a second frequency different from a first frequency of an electric field radiated by the device under test, and a plurality of light receiving elements that correspond to the plurality of electro-optic sensors, each of the light receiving elements generating a light detection signal corresponding to the probe light acting on a corresponding one of the plurality of electro-optic sensors. The plurality of detection signals may correspond to the plurality of light detection signals. The light detection signal is a signal obtained by down-converting an RF signal from the first frequency to the second frequency as a local frequency.

In one embodiment, the front-end unit may include a light source structured to irradiate the plurality of electro-optic sensors with a probe light including a first wavelength and a second wavelength, and a plurality of light receiving elements that correspond to the plurality of electro-optic sensors, each of the light receiving elements generating a light detection signal corresponding to the probe light acting on a corresponding one of the plurality of electro-optic sensors. The plurality of detection signals may be based on a plurality of the light detection signals generated by the plurality of light receiving elements. The light detection signal is a signal obtained by down-converting the RF signal with a frequency based on a difference between the first wavelength and the second wavelength as the local frequency.

In one embodiment, the front-end unit may include a plurality of A/D converters structured to digitize outputs of the plurality of electro-optic sensors, and an interface circuit structured to transmit outputs of the plurality of A/D converters to the tester body.

In one embodiment, the plurality of electric field detection elements may be a plurality of sensor antennas.

In one embodiment, the front-end unit may include a plurality of mixers that correspond to the plurality of sensor antennas, each of mixers mixing an output of a corresponding one of the plurality of sensor antennas with a carrier signal having a second frequency different from a first frequency of an electric field radiated by the device under test. The plurality of detection signals may be based on outputs of the plurality of mixers.

In one embodiment, the front-end unit may include a plurality of A/D converters structured to digitize the outputs of the plurality of mixers, and an interface circuit structured to transmit outputs of the plurality of A/D converters to the tester body.

In one embodiment, the front-end unit may include a digitizer structured to perform undersampling of a plurality of signals generated by the plurality of sensor antennas. The plurality of detection signals may be based on an output of the digitizer.

In one embodiment, the tester body may calculate a far field radiated by the device under test on the basis of the plurality of detection signals.

In one embodiment, the tester body may include a quadrature demodulator structured to perform quadrature demodulation on each of the plurality of detection signals. The phase of the electric field received by each of the plurality of electric field detection elements can be acquired by performing quadrature demodulation on the detection signal.

Embodiment

Hereinafter, a preferred embodiment of the disclosure will be described with reference to the accompanying drawings. The same or similar components, members, and processes illustrated in the drawings are denoted by the same reference numerals, and redundant explanation is omitted as appropriate. In addition, the embodiment does not intend to limit the disclosure but exemplify the disclosure. All of the features described in the embodiment and the combinations thereof are not necessarily essential to the invention or the disclosure.

In the present specification, "a state where a member A is connected with a member B" includes not only a case where the member A and the member B are directly connected physically, but also a case where the member A and the member B are indirectly connected through another member which does not substantially affect an electrical connection state between the members A and B or which does not impair a function or an effect exhibited by coupling between the members A and B.

Similarly, "a state where a member C is provided between the member A and the member B" includes not only a case where the member A and the member C, or the member B and the member C are connected directly, but also a case where the members are indirectly connected through another member which does not substantially affect an electrical connection state between the members or which does not impair a function or an effect exhibited by coupling between the members.

FIG. 1 is a diagram illustrating a test apparatus 100 according to an embodiment. A test object (DUT (device under test) 10 of the test apparatus 100 includes one or a plurality (m) of antenna elements 12. In this example, m (=8) antenna elements 12_1 to 12_m form an antenna array. The DUT 10 may be an antenna array itself or a transceiver device (Antenna-In-Package (AIP)) with an antenna array. Incidentally, in FIG. 1, the DUT 10 is arranged upward, but the posture of the DUT 10 during the test is not limited.

The test apparatus 100 measures the antenna array of the DUT 10 by OTA. The test apparatus 100 includes a tester body 110 and a front-end unit 200.

The tester body 110 is a main body portion of automatic testing equipment (ATE) used to measure a memory, a large scale integrated circuit (LSI), and an integrated circuit (IC), and includes functions and hardware included in a standard tester. Specifically, the tester body has functions of executing a test program, generating a test signal based on the test program, receiving a signal generated by a DUT in response to the test signal, and processing the received signal.

In a test in which a memory, an LSI, and an IC are set as the DUT, the tester body 110 is used together with a test head. The test head is provided with a pin electronics card (board), and the pin electronics card is connected to the DUT via a performance board.

The test apparatus 100 of FIG. 1 includes the front-end unit 200 instead of the performance board.

The front-end unit 200 includes a detection element array 210 including a plurality (n) of electric field detection elements 212_1 to 212_n. The plurality of electric field detection elements 212 are provided to face a plurality of points on a radiation surface S of the antenna element 12 of the DUT 10, and can simultaneously detect electric fields (near field) formed at the corresponding points by the DUT 10. In this example, n (=m×k=8×4=32) electric field detection elements 212 are provided so that the electric field intensity can be detected at k (=4) points per one antenna element 12, and the electric fields at 32 points in total are measured.

The front-end unit 200 includes a front-end circuit 220 in addition to the plurality of electric field detection elements 212_1 to 212_n. The front-end circuit 220 processes outputs of the plurality of electric field detection elements 212_1 to 212_n, and transmits a plurality of detection signals Sd1 to Sdn indicating the electric fields at the plurality of points to the tester body 110 via a cable 102.

The tester body 110 receives the plurality of detection signals Sd1 to Sdn from the front-end unit 200 and inspects the DUT 10.

The electric field (radio wave) generated by the antenna element 12 of the DUT 10 depends on a wireless communication system, but is a radio frequency (RF) signal on the order of several GHz to several tens of GHz. When such a high frequency is transmitted via the cable 102, the transmission cannot be made correctly to the tester body 110 due to waveform distortion and noise. A typical tester body 110 does not have an interface for receiving RF signals of several GHz to several tens of GHz.

In this regard, in the present embodiment, the plurality of detection signals Sd1 to Sdn are obtained by down-converting the outputs of the plurality of electric field detection elements 212 and receivable by existing hardware of the tester body 110. As a result, the existing tester body 110 can be utilized. The existing hardware referred to herein may be, for example, a digital module.

In some cases, the tester body 110 includes an A/D converter as the hardware, but the number of channels is not so large. Alternatively, a module including a multi-channel A/D converter that covers the number n of electric field detection elements 212 is expensive.

In this regard, the front-end unit 200 digitizes the plurality of detection signals Sd1 to Sdn and transmits the digitized detection signals to the tester body 110. This eliminates the need for a multi-channel A/D converter in the tester body 110.

The above is the basic configuration of the test apparatus 100. Subsequently, the operation thereof will be described.

At the time of testing the DUT 10, the tester body 110 operates the DUT 10 to radiate radio waves from the plurality of antenna elements 12_1 to 12_m. In a case where the DUT 10 is an antenna, it is sufficient if an RF signal having an appropriate frequency is input as an input of the antenna from the front-end unit 200. An unmodulated sine wave can be used as the RF signal, but the RF signal is not limited thereto and may be a modulated signal.

In a case where the DUT 10 is an AIP, a control signal CNT is given to the DUT 10 to set the DUT 10 to the test mode, and the oscillator incorporated in the AIP is operated to radiate radio waves from the antenna element 12_1 to 12_m.

The plurality of electric field detection elements 212_1 to 212_n output signals corresponding to respective radio waves (near field) incident on antenna surface. The front-end circuit 220 receives the output signals of the plurality of electric field detection elements 212, converts the output signals into the detection signals Sd1 to Sdn receivable by the tester body 110, and transmits the detection signals to the tester body 110. As described above, the front-end circuit 220 may down-convert the frequency and generate the digitized detection signals Sd1 to Sdn.

The tester body 110 receives the plurality of detection signals Sd1 to Sdn from the front-end unit 200 and processes the detection signals to evaluate the characteristics of the DUT 10. Preferably, the i-th (1≤i≤n) detection signal Sdi has an electric field intensity and phase information of the electric field at the corresponding point on the antenna surface of the DUT 10, and the tester body 110 can calculate the electric field intensities and the phase information at a plurality of points. Further, the tester body 110 may estimate a far field from the electric field intensities and the phase information at the plurality of points, that is, the near field. It is sufficient if a known technique is used as a method or algorithm for estimating the far field from the near field.

The above is the operation of the test apparatus 100.

In summary, the front-end unit 200 functions as an alternative to the performance board (a part of the test head in some cases) when testing a typical semiconductor device, and the front-end unit 200 and the tester body 110 are combined to configure the test apparatus 100. When the detection signals Sd1 to Sdn are transmitted from the front-end unit 200 to the tester body 110 in a form supported by the tester body, it is possible to test an antenna alone or a device with the antenna by OTA by utilizing the existing tester body 110.

The present disclosure encompasses various kinds of devices and methods that can be perceived as a block diagram of FIG. 1 or that can be derived from the above-described description and is not limited to a specific configuration. Hereinafter, specific configuration examples or examples will be described so as not to be intended to restrict the scope of the present disclosure but to ease and clarify understanding of the essence of the present disclosure or the present invention and the operation.

First Example

Figure 2:
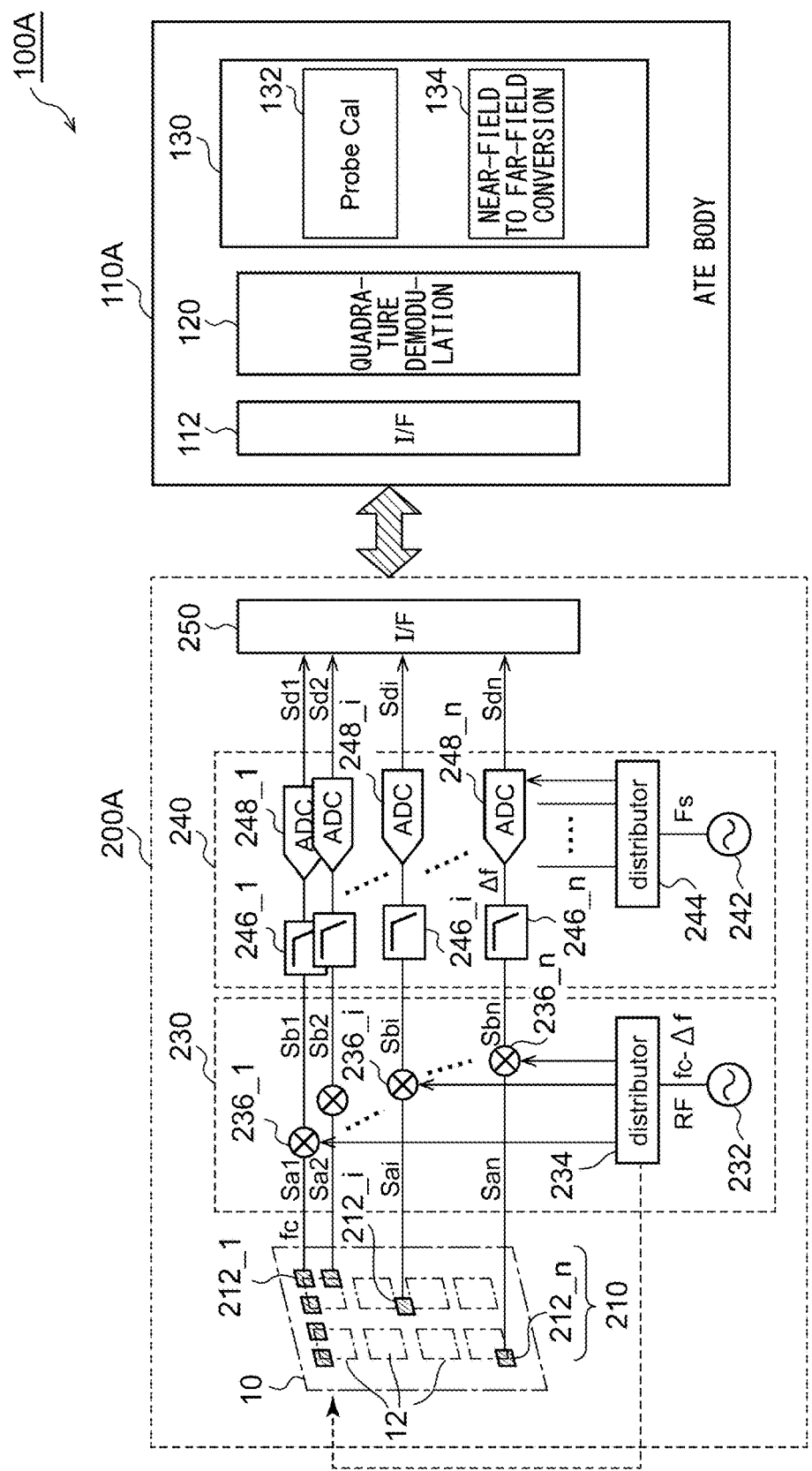
FIG. 2 is a block diagram of a test apparatus according to a first example.

FIG. 2 is a block diagram of a test apparatus 100A according to a first example. As described above, the front-end unit 200A includes the detection element array 210 and the front-end circuit 220. The front-end circuit 220 includes a frequency down converter 230, a digitizer 240, and an interface module 250.

Signals (also referred to as initial signals) Sa1 to San generated by the plurality of electric field detection elements 212_1 to 212_n have the same frequency (several GHz to several tens of GHz) as the frequency (carrier frequency fc) of the radio wave radiated by the antenna element 12.

In the first example, an electrical antenna (in this specification, referred to as a sensor antenna in order to distinguish from the antenna of the DUT) can be used as the electric field detection element 212. As the sensor antenna, a microstrip antenna is suitable, and for example, a patch antenna can be used. Each electric field detection element (sensor antenna) 212 receives a radio wave (electromagnetic field) at the corresponding point, and a coil of the sensor antenna generates an electric signal (a coil voltage or a coil current) having an intensity and a phase corresponding to the electromagnetic field. That is, when the sensor antenna is used, the coil voltage or the coil current becomes the initial signal Sa, and the initial signal Sa has the carrier frequency fc.

The frequency down converter 230 down-converts the high-frequency initial signals Sa1 to San into a frequency Δf which can be processed by a tester body 110A to generate intermediate signals Sb1 to Sbn.

The frequency down converter 230 includes an oscillator 232, a distributor 234, and a plurality (n) of mixer circuits 236_1 to 236_n. The oscillator 232 generates an RF signal having a frequency (for example, f−Δf) having a difference of Δf from the carrier frequency fc.

The distributor 234 distributes the RF signal to the plurality of mixer circuits 236_1 to 236_n. This RF signal may also be provided as the input of the DUT 10, and in this case, the DUT 10 can radiate the RF signal received from a front-end unit 200A from the antenna element 12 during testing.

The i-th (1≤i≤n) mixer circuit 236_i multiplies the initial signal Sai generated by the corresponding electric field detection element 212_i with the RF signal, that is, frequency-mixes the initial signal to down-convert the initial signal into an intermediate signal Sbi having a frequency of Δf.

The digitizer 240 converts the plurality of intermediate signals Sb1 to Sbn generated by the frequency down converter 230 into the digital detection signals Sd1 to Sdn.

The digitizer 240 includes an oscillator 242, a distributor 244, a filter 246, and a plurality (n) of A/D converters 248_1 to 248_n.

The oscillator 242 generates a sampling signal having a sampling frequency Fs. The sampling frequency Fs is determined to be higher than twice Δf.

The distributor 244 distributes the sampling signal to the plurality of A/D converters 248_1 to 248_n. The filter 246 is inserted in a preceding stage of the A/D converter 248.

The i-th A/D converter 248_i converts the corresponding intermediate signal Sbi after filtering into the digital detection signal Sdi in synchronization with the sampling signal.

The interface module 250 transmits the plurality of digitized detection signals Sd1 to Sdn to the tester body 110A.

The tester body 110A includes an interface module 112, a quadrature demodulator 120, and a signal processor 130.

The interface module 112 receives the plurality of digitized detection signals Sd1 to Sdn. The interface module 112 is also referred to as a digital module, and captures the plurality of detection signals Sd1 to Sdn received over a predetermined period as waveform data.

For example, in a case where the radio wave radiated by the DUT 10 is a sine wave which is not modulated, the plurality of initial signals Sa1 to San become sine waves having the same frequency fc, and the intensity and the phase are different for each signal. The down-converted intermediate signals Sb1 to Sbn are sine waves having the same frequency Δf, and the intensity and the phase are different for each signal. The detection signals Sd1 to Sdn received by the tester body 110A are waveform data of the intermediate signals Sb1 to Sbn having the frequency Δf, respectively.

The quadrature demodulator 120 performs quadrature demodulation on each of the plurality of detection signals Sd1 to Sdn. That is, the quadrature demodulator 120 converts the intermediate signals Sb1 to Sbn into baseband signals BB1 to BBn including an I component and a Q component or including amplitude information and phase information. The I component and the Q component are equivalent to the amplitude information and the phase information, and indicate the original electric field intensity and phase at the point of the electric field detection element 212. Incidentally, the quadrature demodulator 120 may be implemented as hardware, or may be implemented by a combination of software and a central processing unit (CPU).

Incidentally, in the OTA test of the antenna, it is sufficient if relative phases at a plurality of points on the antenna surface of the DUT 10 are known. Thus, it is sufficient if relative phases of a plurality of channels CH1 to CHn are aligned, and the quadrature demodulator 120 may operate asynchronously with the front-end unit 200A and the DUT 10. That is, there is an advantage that highly accurate phase matching between the test apparatus 100A and the front-end unit 200A is unnecessary.

The signal processor 130 processes the baseband signals BB1 to BBn indicating the electric field intensity/phase information at the plurality of points, and evaluates the characteristics of the DUT 10. The processing content of the signal processor 130 is not particularly limited, and it is sufficient if the processing content is determined according to the characteristic to be evaluated of the DUT 10.

For example, the signal processor 130 includes a calibration processor 132 and a near-field to far-field conversion processor 134. The signal processor 130 is a processor such as a CPU in terms of hardware, and the calibration processor 132 and the near-field to far-field conversion processor 134 represent functions exhibited by a processor executing a software program (test program).

The calibration processor 132 corrects characteristics based on the structure of the sensor antenna used as the electric field detection element 212, interference between a plurality of sensor antennas, interference between the sensor antenna and the antenna element 12, and the like. The correction target may be a baseband signal or a near-field electric field distribution obtained from the baseband signal.

For example, in a case where the information of the far field of the DUT 10 is necessary, the near-field to far-field conversion processor 134 is provided. The near-field to far-field conversion processor 134 converts a near field into a far field. It is sufficient if a known technique is used as an algorithm of the near-field to far-field conversion processor 134.

Second Example

Figure 3:
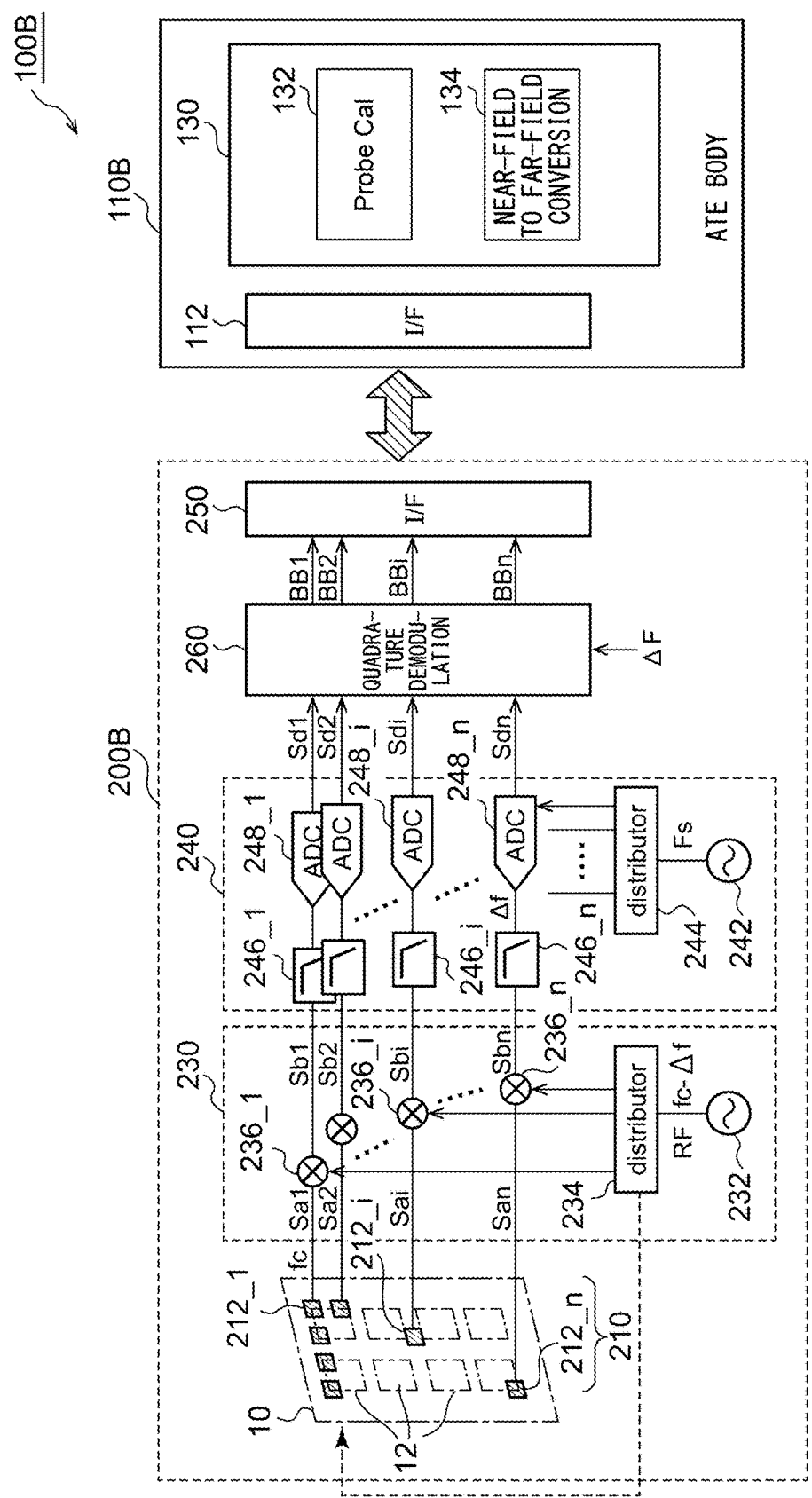
FIG. 3 is a block diagram of a test apparatus according to a second example.

FIG. 3 is a block diagram of a test apparatus 100B according to a second example. In the first example, the quadrature demodulator 120 is mounted on the tester body 110A, but in the second example, the quadrature demodulator 260 is mounted as hardware.

The quadrature demodulator 260 performs quadrature demodulation on each of the outputs Sd1 to Sdn of the digitizer 240 to generate the digital baseband signals BB1 to BBn. The interface module 250 transmits the digital baseband signals BB1 to BBn to the tester body 110B as detection signals.

Incidentally, in the configuration of FIG. 3, the quadrature demodulator 260 is provided at the subsequent stage of the digitizer 240, but the present invention is not limited thereto, and the quadrature demodulator 260 may be provided at the preceding stage of the digitizer 240, and an analog baseband signal may be generated by the quadrature demodulator 260 and converted into a digital baseband signal by the digitizer 240.

Third Example

Figure 4:
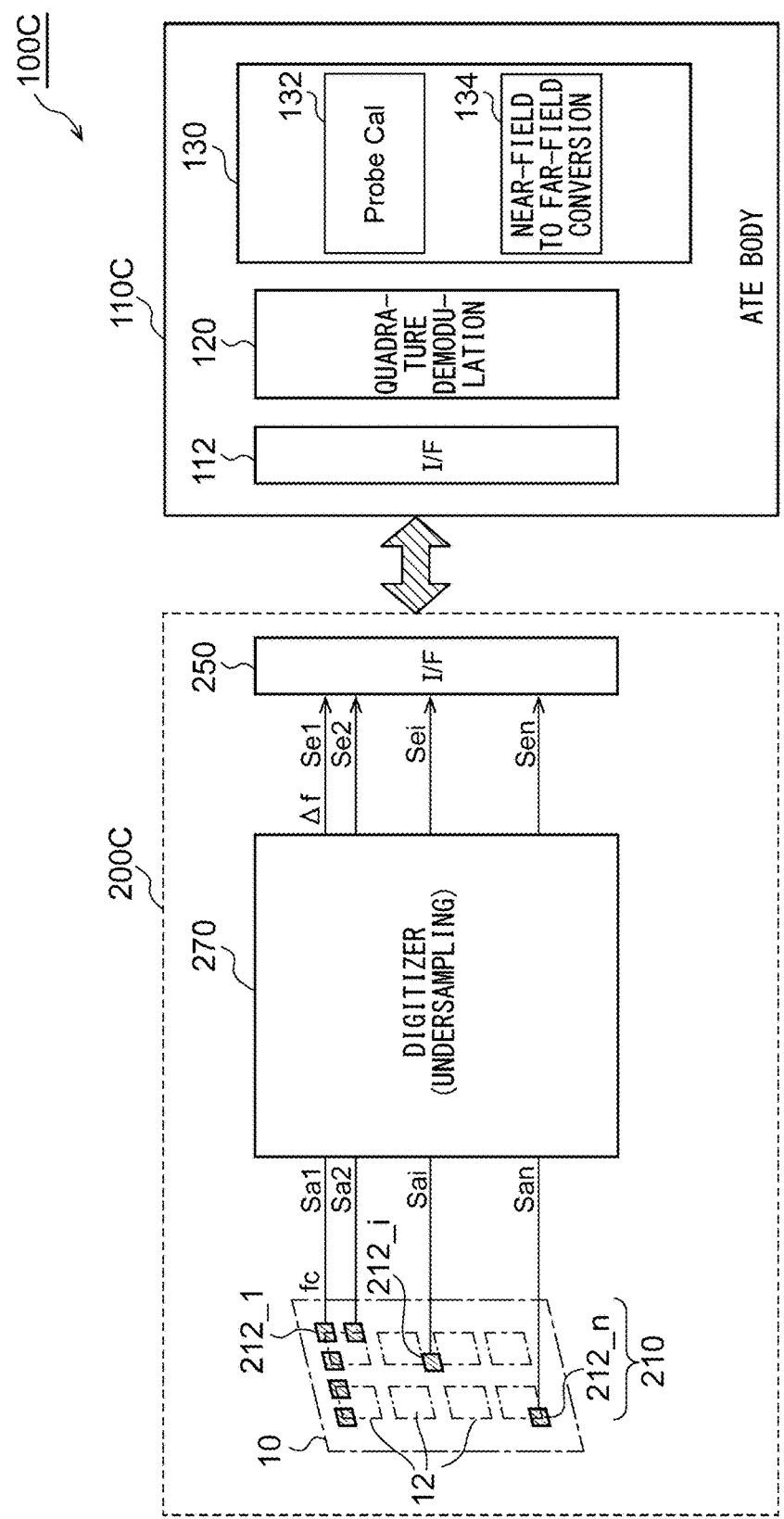
FIG. 4 is a block diagram of a test apparatus according to a third example.

FIG. 4 is a block diagram of a test apparatus 100C according to a third example. The front-end unit 200C includes a digitizer 270. Based on the Nyquist theorem, a typical digitizer (A/D converter) operates at a sampling rate which is twice or more higher than the maximum frequency of the input signal, but this digitizer 270 digitizes the plurality of initial signals Sa1 to San by using a principle of undersampling to generate digital detection signals Se1 to Sen.

Figure 5:
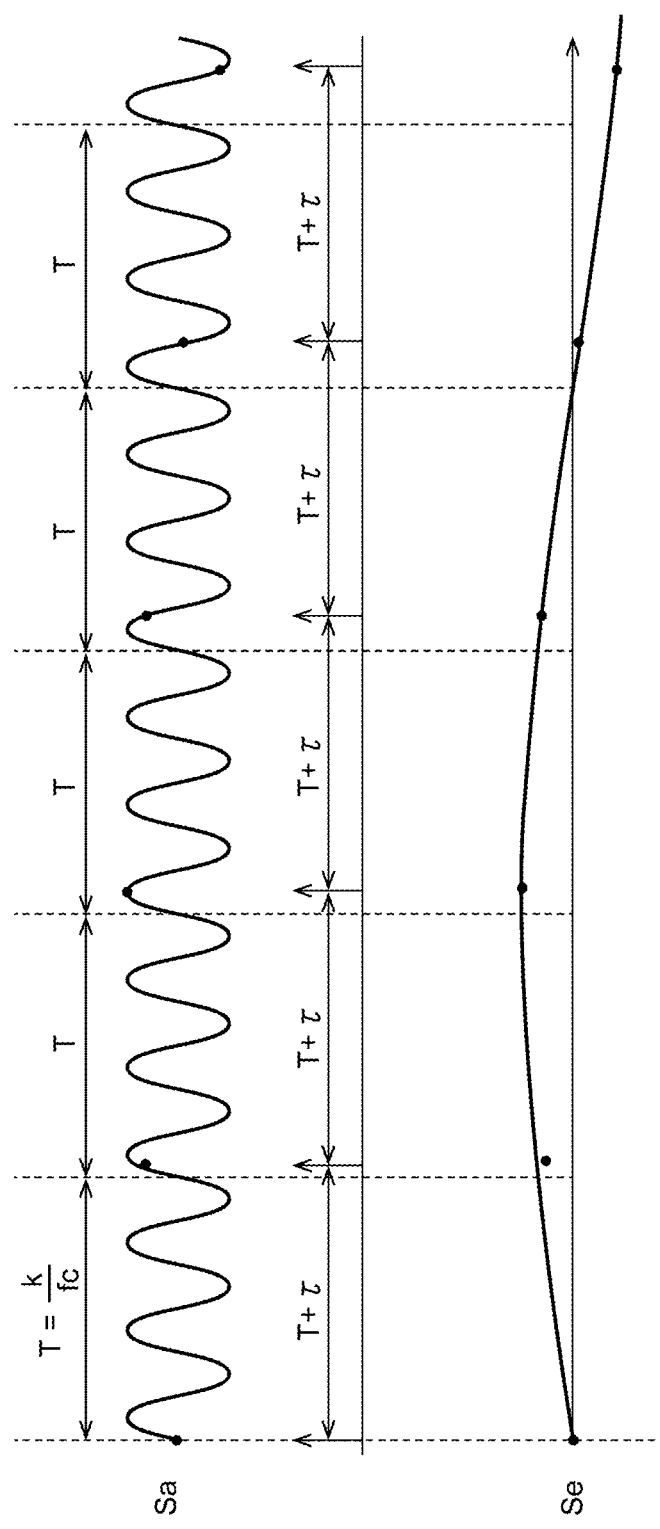
FIG. 5 is a diagram for explaining undersampling by a digitizer.

FIG. 5 is a diagram for explaining undersampling by the digitizer 270. The initial signal Sa has a carrier frequency $f_c$, and the period (carrier period) thereof is $1/f_c$. The digitizer 270 samples the initial signal Sa with a sampling period (T+τ) longer by τ than a time T which is an integral k times of the carrier period. The detection signal Se obtained by the digitizer 270 has the same waveform as that of the initial signal Sa and is a frequency-down-converted signal, which is relevant to the signals Sd1 to Sdn in the first example.

This configuration eliminates the need for a frequency mixer or the like.

In the third example, the quadrature demodulator 260 may be provided at the subsequent stage of the digitizer 270 of the front-end unit 200C to convert the signal Se into the baseband signal BB and transmit the baseband signal BB to the tester body 110.

Fourth Example

Figure 6:
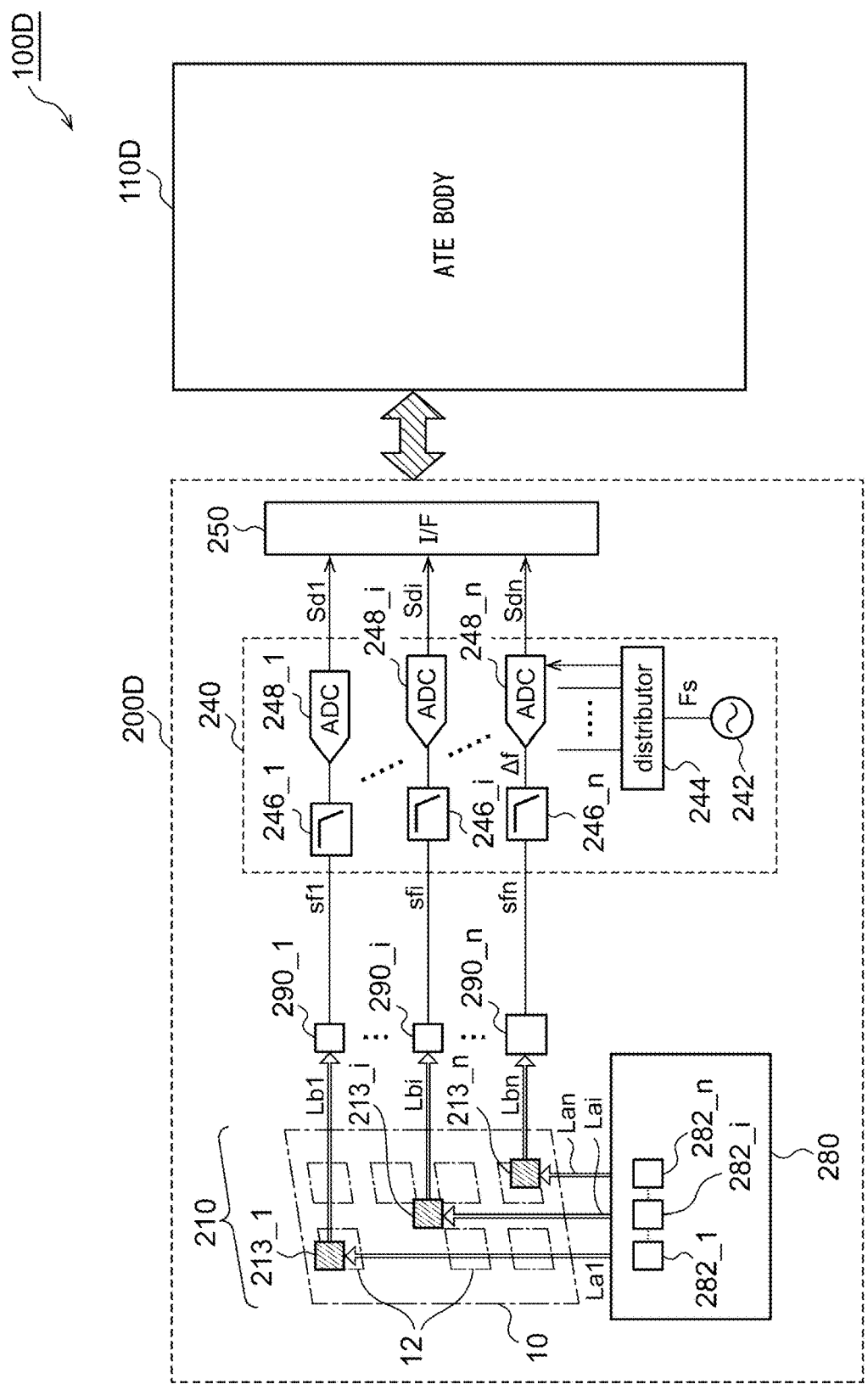
FIG. 6 is a block diagram of a test apparatus according to a fourth example.

FIG. 6 is a block diagram of a test apparatus 100D according to a fourth example.

In the fourth example, an electro-optic (EO) sensor is used as the electric field detection element 212 instead of the antenna. That is, the detection element array 210 includes a plurality of EO sensors 213. A front-end unit 200D further includes a light source 280 and a plurality of light receiving elements 290_1 to 290_n.

The light source 280 irradiates the plurality of EO sensors 213_1 to 213_n with probe lights La1 to Lan modulated at a local frequency $f_{LO}$ (=$f_c$−Δf) different from the carrier frequency $f_c$. The light source 280 may include n light emitting units 282, and the intensities and modulation frequencies of the probe lights La1 to Lan may be settable for respective light emitting units 282. The light emitting unit 282 may be a semiconductor laser such as a vertical cavity surface emitting laser (VCSEL), and the light source 280 may be a VCSEL array.

The plurality of light receiving elements 290_1 to 290_n correspond to the plurality of EO sensors 213_1 to 213_n. The i-th light receiving element 290_i receives the probe light Lbi acting on the corresponding EO sensor 213_i, and generates a light detection signal Sfi indicating the intensity of the received probe light Lbi. As the plurality of light receiving elements 290_1 to 290_n, an array of photodetectors or an array of photodiodes may be used, or a CCD sensor, a CMOS sensor, or the like may be used.

The digitizer 240 converts the plurality of light detection signals Sf1 to Sfn into digital signals. The interface module 250 transmits the digitized light detection signals Sd1 to Sdn to the tester body 110.

The light detection signals Sf1 to Sfn generated by the light receiving element 290_1 to 290_n are signals obtained by down-converting the frequency $f_c$ of the electromagnetic wave received by the EO sensor such that $|f_c-f_{LO}|=\Delta f$. That is, the function of the frequency down converter 230 in the first example is realized by the light source 280 and the light receiving element 290_1 to 290_n.

Fifth Example

Figure 7:
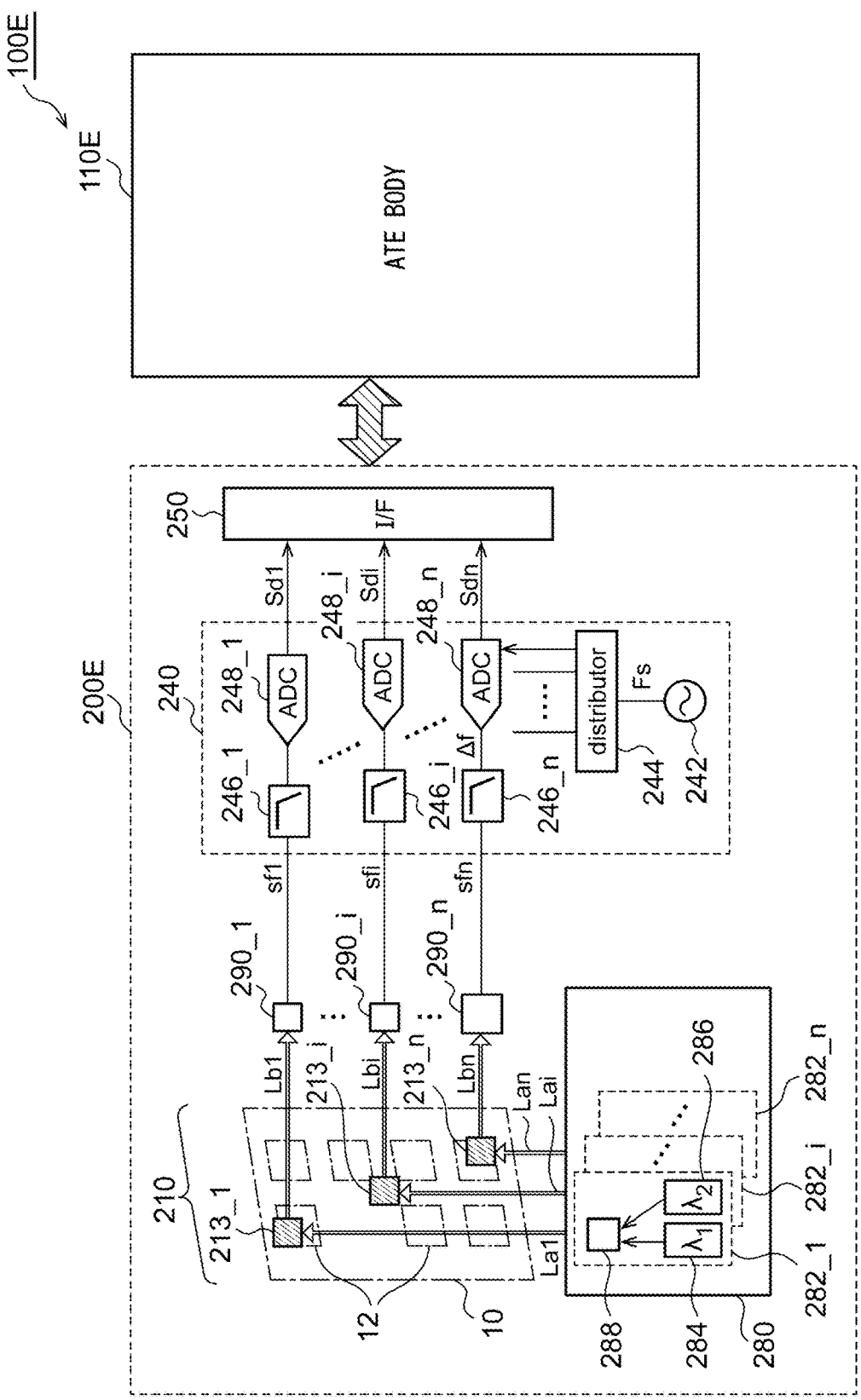
FIG. 7 is a block diagram of a test apparatus according to a fifth example.

FIG. 7 is a block diagram of a test apparatus 100E according to a fifth example. In the fifth example, the light source 280 generates the probe lights La1 to Lan by mixing CW lights having two different wavelengths λ1 and λ2. The light emitting unit 282 may include a first laser 284 that oscillates at a first wavelength λ1, a laser 286 that oscillates at a second wavelength λ2, and an optical coupler 288 that multiplexes two CW laser beams.

In the fifth example, instead of modulating the probe light, a combination of two CW laser beams having different wavelengths is also used as the probe light. As a result, down-conversion can be performed with the frequency corresponding to the difference between the two wavelengths λ1 and λ2 as the local frequency $f_{LO}$.

In the fourth example or the fifth example, in a case where the frequency Δf of the light detection signal Sf is higher than the frequency which can be processed by the tester body 110, the frequency down converter 230 of FIG. 2 may be inserted in the preceding stage of the digitizer 240 to further lower the frequency.

Alternatively, instead of the digitizer 240, the digitizer 270 based on the undersampling illustrated in FIG. 4 may be used to further lower the frequency.

In the fourth example or the fifth example, a digital-output light receiving element 290 may be used, and in this case, the function of the digitizer 240 is incorporated in the light receiving element 290.

Also in the fourth example or the fifth example, the quadrature demodulator may be provided in the front-end unit 200D.

In the fourth example or the fifth example, the light source 280 is divided into the plurality (n) of light emitting units 282, but the present invention is not limited thereto, and the light source may be configured as one light source. In this case, the entire detection element array 210 may be irradiated with a probe light having a substantially uniform intensity distribution.

Although the present disclosure has been described based on the embodiment, the embodiment merely illustrates the principle and application of the present disclosure, and many modifications and changes in arrangement are possible in the embodiment without departing from the spirit of the present invention defined in the claims.

What is claimed is:

1. A test apparatus for testing a device under test which is an antenna element or a device including the antenna element, the test apparatus comprising:
   a front-end unit that includes a plurality of electric field detection elements provided to face a plurality of points on a radiation surface of the antenna element of the device under test and structured to simultaneously detect electric fields formed at corresponding points by the device under test, and to transmit a plurality of detection signals indicating the electric fields at the plurality of points; and
   a tester body structured to receive the plurality of detection signals from the front-end unit and to test the device under test, wherein
   the plurality of electric field detection elements are a plurality of electro-optic sensors.

2. The test apparatus according to claim 1, wherein
   the plurality of detection signals are obtained by down-converting outputs of the plurality of electric field detection elements.

3. The test apparatus according to claim 1, wherein
   the front-end unit is structured to digitize the plurality of detection signals and to transmit the digitized detection signals to the tester body.

4. The test apparatus according to claim 1, wherein the front-end unit includes
- a light source structured to irradiate the plurality of electro-optic sensors with probe lights modulated at a second frequency different from a first frequency of an electric field radiated by the device under test, and
- a plurality of light receiving elements that correspond to the plurality of electro-optic sensors, wherein each of the light receiving elements is structured to generate a light detection signal corresponding to the probe light acting on a corresponding one of the plurality of electrooptic sensors, and wherein
the plurality of detection signals are based on a plurality of the light detection signals generated by the plurality of light receiving elements.

5. The test apparatus according to claim 1, wherein the front-end unit includes
- a light source structured to irradiate the plurality of electro-optic sensors with a probe light including a first wavelength and a second wavelength, and
- a plurality of light receiving elements that correspond to the plurality of electro-optic sensors, wherein each of the light receiving elements is structured to generate a light detection signal corresponding to the probe light acting on a corresponding one of the plurality of electrooptic sensors, and
the plurality of detection signals are based on a plurality of the light detection signals generated by the plurality of light receiving elements.

6. The test apparatus according to claim 4, wherein the front-end unit includes
- a plurality of A/D converters structured to digitize outputs of the plurality of electro-optic sensors, and
- an interface circuit structured to transmit outputs of the plurality of A/D converters to the tester body.

7. The test apparatus according to claim 1, wherein the tester body is structured to calculate a far field radiated by the device under test on a basis of the plurality of detection signals.

8. The test apparatus according to claim 1, wherein the tester body includes a quadrature demodulator structured to perform quadrature demodulation on each of the plurality of detection signals.

* * * * *